United States Patent
Ryding et al.

(10) Patent No.: US 6,515,288 B1
(45) Date of Patent: Feb. 4, 2003

(54) VACUUM BEARING STRUCTURE AND A METHOD OF SUPPORTING A MOVABLE MEMBER

(75) Inventors: Geoffrey Ryding, Manchester; Theodore H. Smick, Massachusetts; Marvin Farley, Ipswich; Takao Sakase, Rowley, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/527,029

(22) Filed: Mar. 16, 2000

(51) Int. Cl.[7] .................. G01F 23/00; G01K 5/08; G01K 5/10; G21K 5/10; G21G 5/00; A61N 5/00
(52) U.S. Cl. .............. 250/441.11; 250/442.11; 250/462.1; 250/492.21
(58) Field of Search ............ 250/441.11, 442.11, 250/492.1, 492.21

(56) References Cited

U.S. PATENT DOCUMENTS

| | | |
|---|---|---|
| 4,191,385 A | 3/1980 | Fox et al. |
| 4,749,283 A | 6/1988 | Yokomatsu et al. |
| 5,898,179 A | 4/1999 | Smick et al. |

FOREIGN PATENT DOCUMENTS

| | | |
|---|---|---|
| JP | 257721 | 2/1990 |
| WO | WO8202235 | 7/1982 |
| WO | WO9913488 | 3/1999 |

OTHER PUBLICATIONS

W.H. Rasnick et al., "Porous Graphite Air–Bearing Components as Applied to Machine Tools," Technical Report, 1974, Society of Manufacturing Engineers, pp. 1–41.

Primary Examiner—John R. Lee
Assistant Examiner—David A. Vanore
(74) Attorney, Agent, or Firm—Boult Wade Tennant

(57) ABSTRACT

A vacuum bearing structure comprises a combination of a planar gas bearing with a differentially-pumped vacuum seal. The bearing surface and the vacuum seal surfaces are formed of a porous material divided into a first outer region through which bearing gas can percolate to provide support and an inner second region providing the vacuum seal. An exhaust groove separates the two regions so that bearing gas can flow to atmosphere. The resulting structure can operate at a lower fly height to reduce loading on the differentially-pumped vacuum seal. The structure is particularly useful for motion feedthroughs into vacuum processes such as ion implantation.

21 Claims, 4 Drawing Sheets

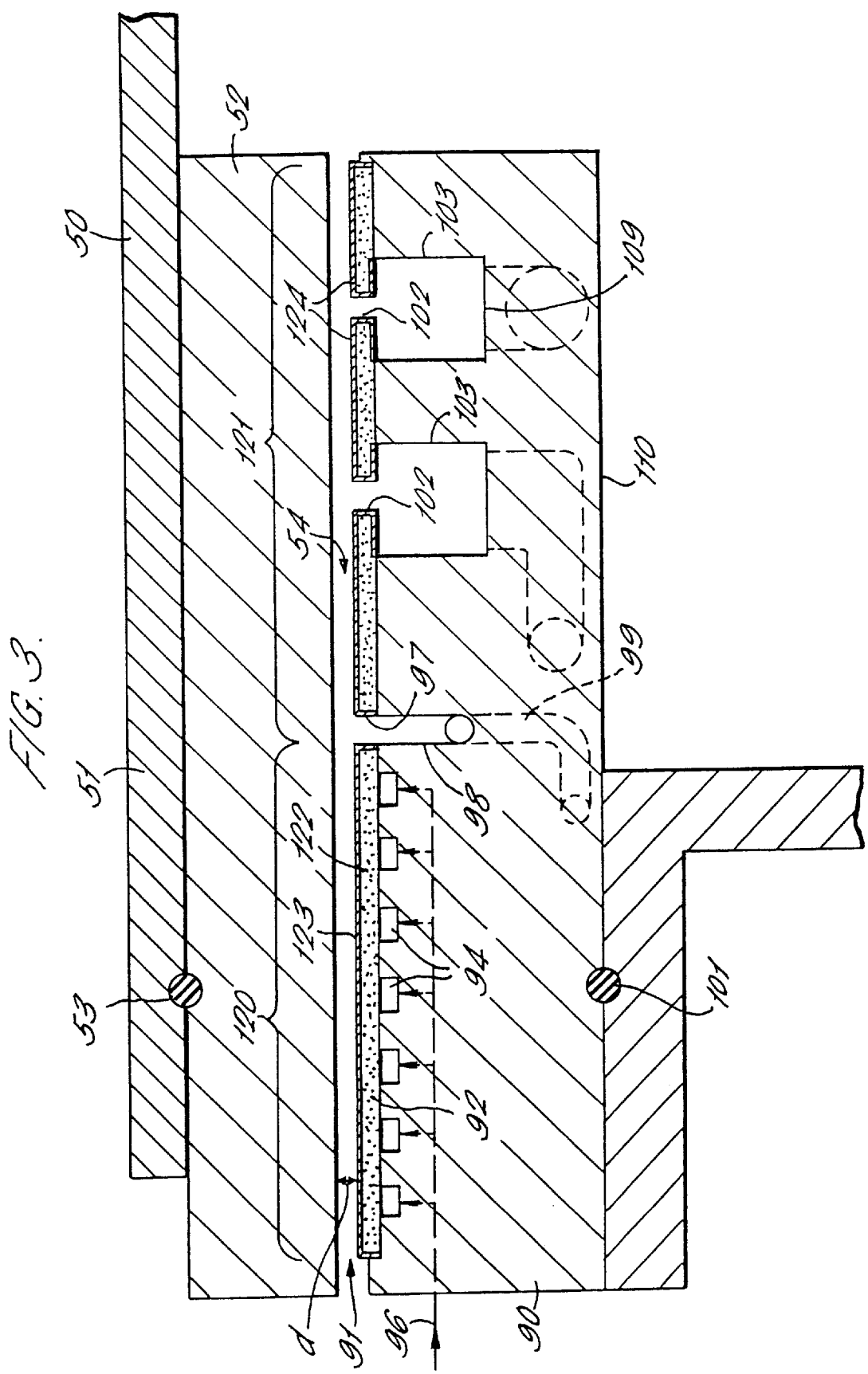

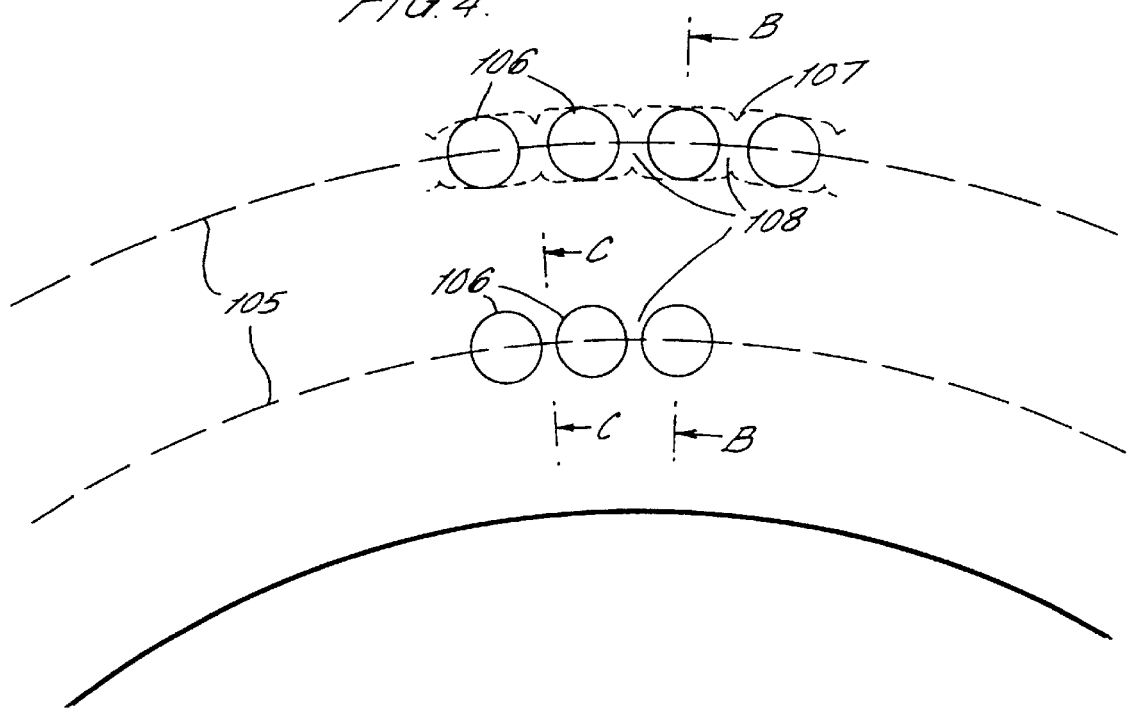
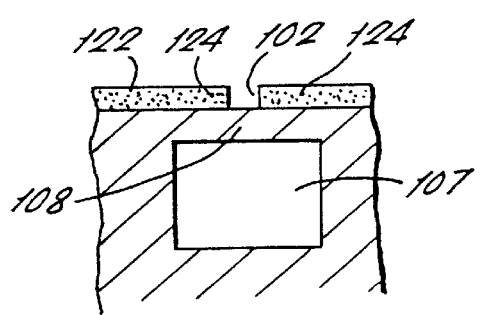

VACUUM BEARING STRUCTURE AND A METHOD OF SUPPORTING A MOVABLE MEMBER

FIELD OF THE INVENTION

The invention relates to vacuum bearing structures and methods of supporting movable members, particularly in apertures provided in walls of vacuum chambers. In a preferred embodiment, the invention is applied in the field of ion implanters.

BACKGROUND OF THE INVENTION

There is often a need to mount movable members within a vacuum chamber, in particular when the movement has to be communicated from outside the vacuum chamber. Electrically powered actuators, such as electric motors, do not work well in a vacuum and so these are normally installed external to a vacuum chamber and some vacuum seal arrangement provided which will permit the required motion of the member within the vacuum chamber to be communicated from outside. Similarly, hydraulic or other fluid pressure actuation is normally to be avoided within a vacuum chamber.

Rotary vacuum seals are well known, for example ferromagnetic fluid seals. Seals accommodating a linear motion are usually more problematic and prior art solutions include flexible bellows-type seals.

Vacuum seals accommodating a linear motion have been proposed using a combination of an air bearing and a differentially-pumped vacuum seal located between the air bearing and the interior of the vacuum chamber. An earlier proposal for such an arrangement is contained in WO 82/02235 (Fox). An arrangement of this kind for use in an ion implanter is disclosed in U.S. Pat. No. 5,898,179 (Smick et al). This U.S. patent also describes use of the air bearing seal combination in a relatively large radius rotary arrangement.

There is obviously a conflict between the requirements of a gas or air bearing and the need to prevent gas leakage into the vacuum chamber.

The arrangement disclosed in the above U.S. patent to Smick et al can work well, but there is still a requirement to reduce the loading on the differential pumping and to ensure minimal gas leakage into the vacuum chamber through the differentially-pumped seal.

Accordingly, it is an object of the present invention to improve the performance of the above-referred vacuum bearing structures using a combination of a gas bearing and a differentially-pumped vacuum seal for motion feedthrough into vacuum chambers.

SUMMARY OF THE INVENTION

In one aspect the present invention provides a vacuum bearing structure comprising: a vacuum chamber including a wall having an aperture, a movable member arranged to extend through said aperture, one of said vacuum chamber wall and said movable member having a first bearing surface provided thereon, the other of said vacuum chamber wall and said movable member having a second bearing surface provided thereon, said first and second bearing surfaces extending transverse to the line of action of external pressure acting on said movable member to urge said surfaces towards each other, said first and second bearing surfaces permitting a predetermined movement of said movable member relative to said chamber wall, said first bearing surface being provided by porous gas-permeable material facing said second bearing surface, said porous material having a first region which is porous to gas flow through the thickness of the material and a second, inner region between said first region and the interior of the vacuum chamber, at least one gas supply plenum beneath said first region for a supply of bearing gas under pressure to percolate through said porous first region to apply a bearing pressure to said second bearing surface opposing the action of said external pressure, an exhaust groove through said porous material and positioned between said first region and said second, inner region thereof, and an exhaust plenum connecting to said exhaust groove for allowing bearing gas to escape from between said bearing surfaces.

The use of porous material for gas bearing arrangements is itself not new. An article entitled "Air bearings take off" published in FT Design, April 1999, describes the use of porous graphite material for air bearings in a number of applications. However, an important feature of this aspect of the present invention is that the porous material covering one of the bearing surfaces is divided into a first region and an inner second region. Bearing gas is supplied to the first region from a plenum beneath the first region to provide the supporting gas for the bearing and an exhaust groove is provided through the porous material between the first region and the inner second region so that bearing gas escaping from the bearing surfaces towards the interior can be exhausted away to atmosphere. The inner second region of porous material can then be used to provide the vacuum seal arrangement.

This design is particularly though not exclusively applicable to relatively large scale vacuum bearings, such as may be used for example in the above-referred U.S. patent to Smick et al. In such arrangements, it is very important that the bearing surfaces themselves and also the inner vacuum seal surfaces are machined accurately flat, and usually coplanar. By making both the first region of the surface, which provides the gas bearing support, and the inner second region of the surface, which provides the vacuum seal region, of the same porous material, these can be machined simultaneously to a very high degree of mutual flatness.

At least one continuous differential pumping groove is preferably provided through said second region of the porous material, between said exhaust groove and the interior of the vacuum chamber. Lands of the first bearing surface are thus provided in the second region of the porous material on each side of the differential pumping groove. A differential pumping plenum is also provided connecting to the differential pumping groove for connection to a vacuum pump.

At least the first region of the porous material may have a surface facing said second bearing surface which is impregnated to provide a substantially uniform porosity at said surface which is lower than the porosity of the porous material. By "lower porosity", it is meant that the resistance to gas flow is higher.

In another aspect the invention provides a vacuum bearing structure comprising a vacuum chamber including a wall having an aperture, a movable member arranged to extend through said aperture, a bearing between said vacuum chamber wall and said movable member allowing a predetermined movement therebetween, first and second spaced opposed sealing surfaces on said vacuum chamber wall and said movable member, a continuous differential pumping groove in said first sealing surface, respective lands of said first sealing surface on each side of said differential pumping groove, a differential pumping plenum extending beneath said differential pumping groove and having a width greater than the width of said differential pumping groove so that at least one edge of the differential pumping groove is cantilevered over the underlying differential pumping plenum, and bridging elements crossing over said differential pumping element under said differential pumping groove to support said at least one cantilevered edge of the differential pumping groove.

This construction is especially useful when the first bearing surface containing the differential pumping groove is formed of a layer of porous material overlying a solid substrate. It is generally important for differential pumping arrangements for the lands on either side of a pumping groove to be as extensive as possible in the direction towards the interior of the vacuum chamber. Thus, the differential pumping grooves themselves should be relatively narrow. However, to ensure good gas conductivity from the differential pumping groove to the vacuum pump, the plenum connected to the differential pumping groove should itself be as large as possible. This construction results in at least one edge of the differential pumping groove extending in a cantilevered fashion over the underlying plenum.

When the structure is formed, the first bearing surface must be machined flat to a very high tolerance. The grinding or machining action on the surface would tend to cause a small deviation of the cantilevered edge or edges of the differential pumping groove, if these are unsupported. Once the load on the first bearing surface from the grinding or machining action is removed, the cantilevered edges recover, with the result that there is a slight excess of material at the edges, above the plane of the accurately flat surface of the first bearing surface.

By providing the bridging structure described above, the edges of the bearing surface are supported during the grinding action to very much reduce this effect.

The invention also provides a method of supporting a movable member in an aperture provided in a wall of a vacuum chamber, wherein one of said vacuum chamber wall and said movable member has a first bearing surface and the other has a second bearing surface, and the first and second surfaces extend transverse to the line of action of external pressure acting on said movable member to urge said first and second surfaces towards each other and permit a predetermined movement of said movable member relative to said chamber wall, the method comprising the steps of providing a porous gas-permeable material as said first surface facing said second surface, said porous material having a first outer region which is porous to gas flow through the thickness of the material and a second, inner region, applying gas under pressure via a gas supply plenum to said first region to permit gas under pressure to percolate through said first region to apply bearing pressure to said second surface opposing the action of said external pressure, and exhausting gas to atmosphere via an exhaust channel between said outer and inner regions.

Examples of the invention will now be described with reference to the drawings.

BRIEF DESCRIPTION OF THE DRAWINGS

FIG. 3 is an enlarged sectional view illustrating the gas bearing and vacuum seal arrangement between the rotor and a stator fastened to the chamber wall;

FIG. 4 is a view of the surface of the stator of FIG. 3 with the porous material layer removed showing the differential pumping plenums; and FIG. 5 is a cross-sectional view of a differential pumping plenum taken along line C—C of FIG. 4 and illustrating the substrate bridges underlying the cantilevered edges of the porous layer.

DESCRIPTION OF THE PREFERRED EMBODIMENT

Figure 1:
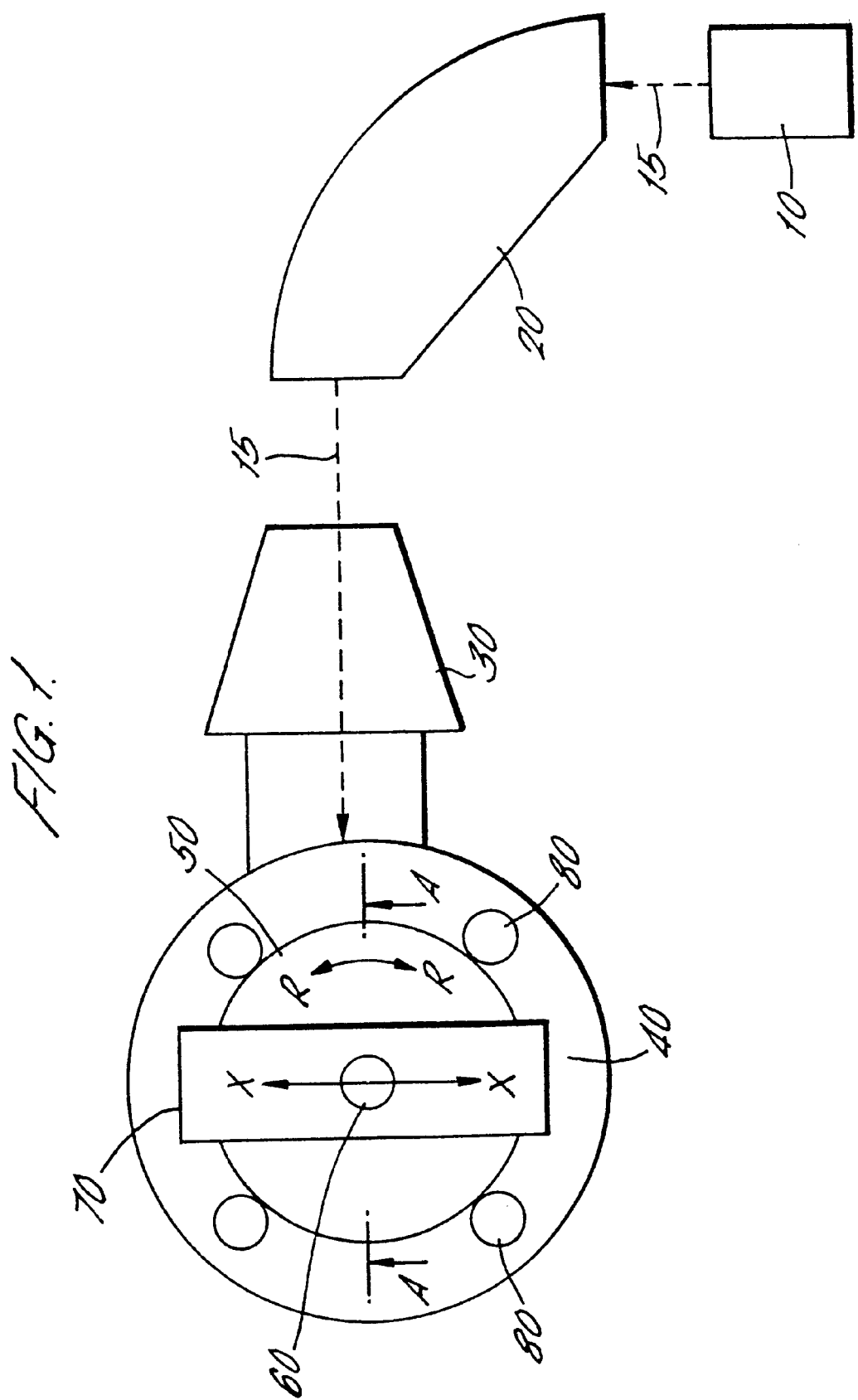
FIG. 1 illustrates a schematic side view of an ion implanter including a process chamber shown in elevation.

Referring first to FIG. 1, a schematic side view of an ion implanter is shown. The ion implanter includes an ion source 10 which is arranged to generate an ion beam 15. The ion beam 15 is directed into a mass analyser 20 where ions of a desired mass/charge ratio are selected electromagnetically. Such techniques are well-known to those skilled in the art and will not be detailed further. It should be noted that, for convenience, the mass analyser 20 has been illustrated in FIG. 1 as bending the beam of ions from the source 10 in the plane of the paper, which is a vertical plane in the context of other parts of the illustrated implanter. In practice the analyser 20 is usually arranged to bend this ion beam in a horizontal plane.

The ion beam 15 exiting the mass analyser 20 may be subject to electrostatic acceleration or deceleration of the ions, depending upon the type of ions to be implanted and the desired implantation depth.

Downstream of the mass analyser is a process or vacuum chamber 40 containing a wafer to be implanted. In the present embodiment, the wafer is a single wafer, for example 200 mm or 300 mm in diameter.

The ion beam which exits the mass analyser 20 generally has a beam width and height which is substantially smaller than the diameter of the wafer to be implanted. The ion beam may be scanned electrostatically or electromagnetically in a first plane (perpendicular to the paper in FIG. 1). The wafer is scanned mechanically in a second direction orthogonal to the direction of scanning of the ion beam. To scan the wafer mechanically, the wafer is mounted upon a substrate support. This consists of a plate onto which the wafer is mounted within the process chamber 40, and an elongate arm connected to the plate.

The elongate arm extends out through the wall of the process chamber in a direction generally parallel with the scanning plane of the ion beam. The arm passes through a slot (not shown) in a rotor plate 50 which is mounted adjacent to a side wall of the process chamber 40. The end 60 of the scanning arm is mounted within a scanning member 70. To effect mechanical scanning of the scanning arm (and hence the wafer mounted upon the plate) relative to the scanned ion beam, the scanning member 70 is movable in a reciprocating manner in the direction shown by the arrows X in FIG. 1. To facilitate this scanning, the undersurface of the scanning member 70 is spaced from the upper surface of the rotor plate 50 by a cushion of compressed air which acts as an air bearing.

The scanning member 70 in FIG. 1 is shown in a vertical position such that the surface of the wafer is perpendicular to the plane of the scanned or fanned instant ion beam. However, it may be desirable to implant ions from the ion beam into the wafer at an angle. For this reason the rotor plate 50 is rotatable about an axis defined through its centre, relative to the fixed wall of the process chamber 40. In other words, the rotor plate 50 is able to rotate in the direction of the arrows R shown in FIG. 1.

As with the scanning member 70, movement of the rotor plate 50 relative to the wall of the process chamber is facilitated with an air bearing between a surface of the rotor plate 50 and a surface of a stator 90 (shown in FIG. 2) mounted upon a flange 100 (FIG. 2) extending radially from a wall of the process chamber 40. Radial movement of the rotor plate is constrained by a series of guide wheels 80 arranged around the circumference of the rotor plate 50. Unwanted axial movement of the rotor plate is prevented in use by the pressure differential between the two faces of the rotor plate. In particular, the inside of the process chamber is evacuated and a large force due to atmospheric pressure accordingly acts to hold the rotor plate against the stator.

The mechanical scanning arrangement described above is generally similar to that described in the aforementioned WO 99/13488, the contents of which are hereby incorporated in their entirety by reference.

Figure 2:
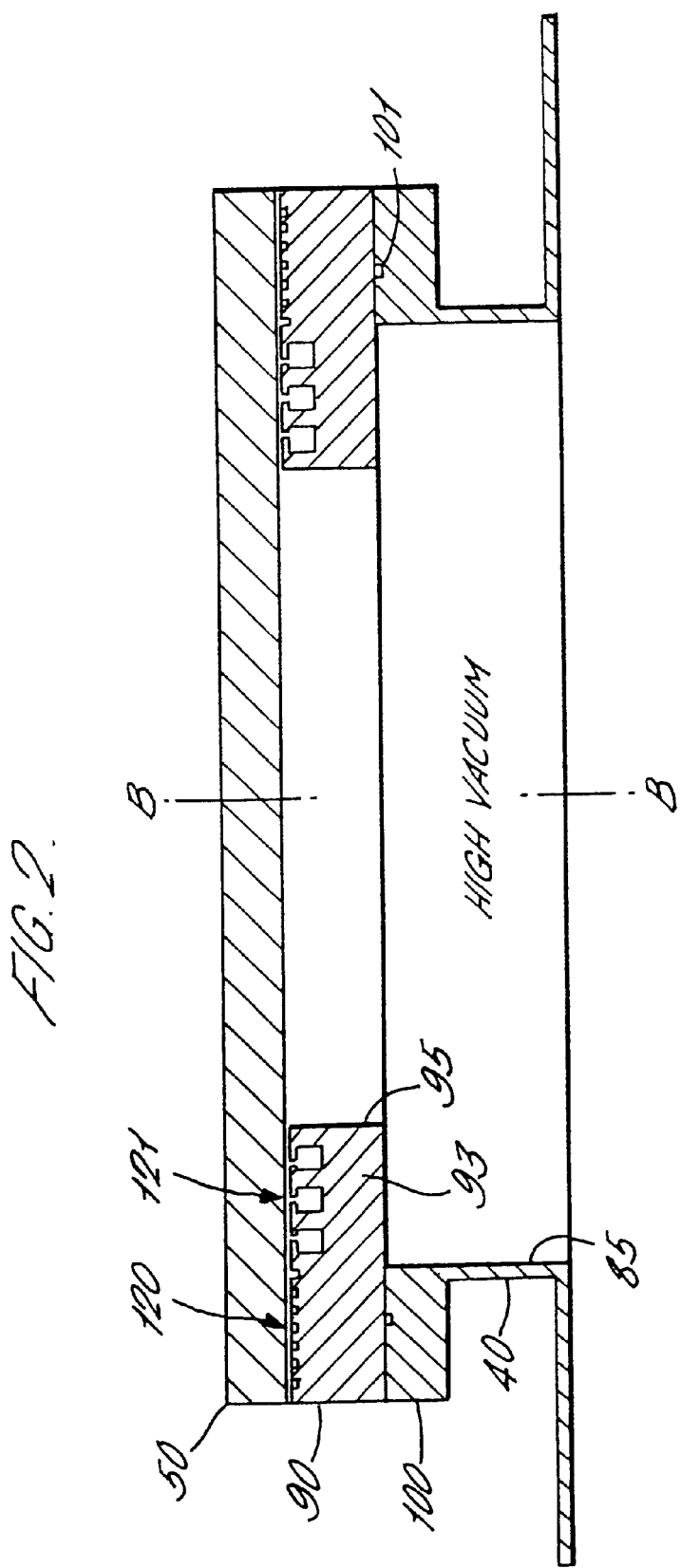
FIG. 2 is a sectional view along line A—A of FIG. 1 illustrating only the vacuum seal between the rotor of FIG. 1 and the vacuum chamber wall.

Referring now to FIGS. 2 and 3, a sectional view along the line A—A of the process chamber 40 of FIG. 1 is shown. For simplicity of illustration, the scanning member 70 and the scanning arm are omitted.

The wall of the process chamber 40 has a generally circular aperture (indicated by reference numeral 85 in FIG. 2) in it. An annular flange 100 extends around the edge of the circular aperture 85. The annular stator 90, whose purpose will be described below and which has an aperture 95 defined by a wall 93, is affixed to the flange 100, the stator 90 and aperture 95 being substantially coaxial with the axis B—B of the circular aperture 85. Fixing of the stator 90 to the flange 100 may be achieved by the special mounting technique described in copending U.S. Ser. No. 09/293,954 assigned to the Assignee hereof, the contents of which are incorporated by reference. Again for simplicity, this is not illustrated in FIGS. 2 or 3, in which a vacuum seal between the flange 100 and stator 90 is indicated by an O-ring seal 101.

In FIG. 2, the rotor plate 50 is illustrated bearing directly against the annular stator 90. As shown, the annular stator 90 has a radially outer region 120 providing a gas bearing region and a radially inner region 121 providing a differentially-pumped vacuum seal.

Although in FIG. 2 the lower face of the rotor plate 50 is illustrated directly bearing on the annular stator 90, in a practical arrangement, such as illustrated in FIG. 3, the rotor plate 50 may include a support plate 51 mounted on an annular rotor member 52 also by means of the special mounting technique described in the above-referred copending U.S. application Ser. No. 09/293,954. Again this is not illustrated in FIG. 3 for simplicity and the vacuum seal between the support plate 51 and rotor element 52 is illustrated by an O-ring seal 53. Importantly, the special mounting between the support plate 51 and annular member 52 is arranged to ensure the force due to atmospheric pressure is directed on the annular rotor element 52 substantially over the air bearing region 120. Also, the special mounting arrangement is arranged to mechanically decouple the annular rotor element 52 from any torsional loading from the support plate 51, again due to atmospheric pressure.

As best shown in FIG. 3, the annular stator 90 has a first bearing surface shown generally at 91 facing a second bearing surface 54 of the annular element 52 of the rotor 50. The surfaces 91 and 52 are each planar, parallel to each other and normal to the direction of action of atmospheric pressure on the rotor 50, which tends to force the two surfaces together. The bearing surface 91 of the stator 90 is provided by a layer 92 of porous graphite material bonded to the surface of the underlying substrate material (typically stainless steel) of the annular stator 90. The radially outer part 120 of the porous layer 92 overlies a number of concentric annular grooves 94 formed in the annular stator 90. Each of the grooves 94 are connected to a source of pressurized gas by lines shown schematically in FIG. 3 at 96. Compressed gas delivered along lines 96 to the underside of the porous layer 120 percolates through the layer to form a gas supporting layer between the first and second bearing surfaces which tends to hold the rotor 50 away from the bearing surface of the stator 90, resisting the force of atmospheric pressure.

In the illustration of FIG. 3, the bearing surface of the annular element 52 of the rotor 50 is shown held spaced by a distance d from the surface provided by the porous layer. In the illustration the size of the spacing d is very much exaggerated.

Radially inside the gas bearing region 120, the differentially-pumped vacuum seal region 121 is also formed by a layer of the porous material over the underlying metal of the annular stator 90. Importantly, the bearing surface provided by the porous material both in the gas bearing region 120 and the differentially-pumped vacuum seal region 121 is accurately planar, so that the spacing d (called the fly height) of the annular element 52 of the rotor 50 from the annular stator 90 is the same both over the bearing region 120 itself and over the differentially-pumped vacuum seal region 121.

Between the bearing surface region 120 and the inner vacuum seal region 121, a groove 97 is formed through the porous layer communicating with a plenum 98 in the annular stator 90, which in turn communicates via a conduit shown schematically at 99 with atmosphere. Thus, high pressure gas escaping radially inwards from between the bearing surfaces in the region 120 can escape to atmosphere through the groove 97. The groove 97 extends continuously around the annular stator 90 so that gas pressure at the outermost edge of the differentially-pumped vacuum seal region 121 is substantially atmospheric.

Radially inside the venting groove 97, the porous layer 122 is pierced by one or more differential pumping grooves 102, communicating with underlying differential pumping plenums 103. In FIG. 3 only two differential pumping grooves 102 and associated plenums 103 are illustrated (compared with three stages shown in FIG. 2). The number of differential stages for the differentially-pumped vacuum seal depends on the efficiency of the sealing arrangement and, in particular, the efficiency of the vacuum pumps attached to the plenums 103; the width of the lands on the surface of the porous layer 122 between the venting groove 97, the respective differential pumping grooves 102, and the interior of the vacuum chamber; and most significantly the fly height d between the bearing surfaces.

In a preferred embodiment, the porous layer 122 is formed of porous graphite. In the outer gas bearing region 120, the porous layer 122 is preferably impregnated over the exposed bearing surface so as to provide a controlled level of porosity at the surface which is generally lower than the porosity of the bulk graphite material through the thickness of the layer 122. The impregnation of the bearing surface is illustrated at 123.

Providing a controlled porosity at the surface of porous media gas bearings is known to improve stability of the bearing over a range of loads. This arises because it is difficult to form porous media, especially graphite, with uniform porosity through the bulk of the material. However a higher level of uniformity of effective porosity can be provided by impregnating a surface of the porous layer as described. The impregnation of the surface of the porous graphite air bearing components to improve stability is discussed in "Porous Graphite Air Bearing Components as Applied to Machine Tools", by W. H. Rasnick et al, 1974, Society of Manufacturing Engineers Technical Report.

The inner region 121 of the porous graphite bearing surface is impregnated over all exposed surfaces of the graphite layer so as to render the graphite substantially impervious to gas.

In constructing the combined gas bearing and differentially-pumped vacuum seal arrangement, such as illustrated in FIGS. 2 and 3, the first bearing surface formed by the porous graphite layer 122 is machined after the porous graphite has been secured, by adhesive, to the underlying surface of the annular stator 90. The whole exposed surface of the graphite layer 122, both over the outer gas bearing region, and the inner vacuum seal region, is machined together to ensure that the various parts of the graphite surface are accurately flat and coplanar. Similarly, the facing surface of the annular element 52 of the rotor is also machined to be accurately planar.

FIGS. 4 and 5 illustrate a preferred formation of the plenums 103 in the annular stator 90. The section through the plenums illustrated in FIG. 3 is taken along line B—B of FIG. 4. In FIG. 4, the line of the plenums 103 and also of the differential pumping grooves 102 is illustrated schematically by the arcs 105. FIG. 4 illustrates the surface of the annular stator 90, with the graphite layer removed. Rather than the plenums 103 forming a continuous trench around the exposed underlying surface of the annular stator 90, the plenums comprise successive circular openings 106 through the surface, with these openings 106 communicating with a continuous channel 107 forming the plenum 103. The regions between successive circular openings 106 form bridges 108 crossing over the continuous channel 107. This is best illustrated in FIG. 5 which is a cross-section taken along line C—C of FIG. 4. Here it can be seen that bridges 108 extend right across of the continuous channel 107 forming the corresponding plenum 103, and thereby provide support to the edges 124 of the porous material layer 122, which are cantilevered over the plenum 103 in the region of the circular openings 106, as illustrated in FIG. 3.

The advantages of this construction of the plenums 103 are twofold. Firstly, it is important for the plenums 103 to be as large as possible to maximize gas conductivity to the vacuum sources used for the differential pumping of a vacuum seal. Accordingly, it is desirable if the plenums 103 extend through a substantial proportion of the thickness of the annular stator 90 (in fact a greater proportion than has been illustrated in the schematic diagram of FIG. 3). As a result, the thickness of material of the annular stator 90 between the bases 109 of the plenums 103, and the lower surface 110 of the annular stator 90 may be insufficient to provide sufficient strength and rigidity to the annular stator, especially to support the bearing surface 91 during grinding of the surface. By constructing the plenums 103 as illustrated in FIGS. 4 and 5, the bridges 108 greatly increase the rigidity and stiffness of the annular stator 90.

Secondly, bridges 108 provide support to the cantilevered edges 124 of the porous layer 122, again to resist deflection of these cantilevered edges during the machining of the bearing surface 91. In the absence of the supporting bridges 108, the overhanging edges 102 of the porous layer 122 would be deflected into the plenums 103 during grinding. On completion of grinding, the edges would recover, presenting portions of the bearing surface 91 slightly raised above the level of the rest of the surface.

Although the above-described construction of the differential pumping plenums is particularly useful for structures employing a layer of porous material as the bearing surface, it should be noted that the same construction may also be useful if the bearing surface is a layer of bronze or other known bearing material. Furthermore, a similar construction may be employed when the annular stator, or other bearing component, is formed as a single unitary piece, itself providing the bearing surface. Then the form is as illustrated in cross-section in FIGS. 3 and 5 but the layer 122 is not formed as an additional layer applied to the underlying surface of the substrate material; instead it is formed integrally of the substrate material, providing the differential pumping grooves 102, plenums 103 and bridges 108 interconnecting opposite sides of the plenums 103 beneath the grooves 102.

It should also be appreciated that the construction of the plenums 103 illustrated in FIGS. 3, 4 and 5 can be used in differentially-pumped vacuum seals, used separately as well as in combination with a gas bearing arrangement, as particularly described in this embodiment. Also, the plenum design may be used for differentially-pumped vacuum seal arrangements used in combination with other forms of gas bearing, such as those using nozzles and/or grooves in the bearing surface rather than a porous media layer.

In the preferred embodiment of the invention described above, the porous layer 122 is formed of porous graphite. Other possible porous materials for the layer 122 are alumina, sintered bronze or titanium carbide coated with graphite. However, porous graphite is particularly useful in view of the surface bearing properties of the material.

One advantage of the use of porous media, particularly porous graphite gas bearing arrangements, is that the stiffness of the bearing continues to increase with reductions in the fly height d. This has particular advantages when the gas bearing is used in a motion feedthrough arrangement into a vacuum chamber. As mentioned previously, the efficiency of the differentially-pumped vacuum seal provided by region 121 of the bearing surface (FIG. 3) is highly dependent on the fly height d of the bearing. With a porous graphite gas bearing, the fly height can be set at between 3 and 7 microns or less. As a result, the escape of bearing gas into the interior of the vacuum chamber can be very much reduced, to the extent that the effect is negligible. Furthermore, it should be possible to reduce the number of successive stages of the differentially pumped vacuum seal, thereby reducing cost and complexity.

Importantly, it has proved possible to operate the combination gas bearing and differentially-pumped vacuum seal at a fly height d approaching zero. To achieve this, the flow rate of bearing gas through the feed 96 is set at a minimum rate at which the friction in the bearing is just zero. At such a setting, the bearing gas percolating from the porous surface of the graphite layer 122 is just sufficient to reduce the contact pressure between the two bearing surfaces 54 and 91 to substantially zero, but without producing any significant liftoff (d≈0). With such a setting, the differentially-pumped vacuum seal in region 121 can work optimally with minimum conduction of gas over the lands 124.

In the above-described embodiment, the combination gas bearing and differentially-pumped vacuum seal has been disclosed in relation to the bearing and seal between the rotor 50 and stator 90 of the wafer scanning mechanism in an ion implanter of the kind described in WO 99/13488. It should first be noted that the same form of combined gas bearing and differentially-pumped vacuum seal can also be used for the bearing and seal between the linear scanning member 70 and the rotor 50. Furthermore, the described arrangement of bearing and seal can also be used in other applications where it is required to provide a motion feedthrough into a vacuum chamber, both in connection with ion implanters and other vacuum equipment.

What is claimed is:

1. A vacuum bearing structure comprising:
    a vacuum chamber including a wall having an aperture,
    a movable member arranged to extend through said aperture,
    one of said vacuum chamber wall and said movable member having a first bearing surface provided thereon,
    the other of said vacuum chamber wall and said movable member having a second bearing surface provided thereon,
    said first and second bearing surfaces extending transverse to the line of action of external pressure acting on said movable member to urge said surfaces towards each other,
    said first and second bearing surfaces permitting a predetermined movement of said movable member relative to said chamber wall,
    said first bearing surface being provided by porous gas-permeable material facing said second bearing surface,
    said porous material having a first region which is porous to gas flow through the thickness of the material and a second, inner region between said first region and the interior of the vacuum chamber,
    at least one gas supply plenum beneath said first region for a supply of bearing gas under pressure to percolate through said porous first region to apply a bearing pressure to said second bearing surface opposing the action of said external pressure,
    an exhaust groove through said porous material and positioned between said first region and said second, inner region thereof, and
    an exhaust plenum connecting to said exhaust groove for allowing bearing gas to escape from between said bearing surfaces.

2. A structure according to claim 1, wherein said first bearing surface is provided by a layer comprising porous graphite material.

3. A structure according to claim 1, wherein the first bearing surface is provided on said vacuum chamber wall.

4. A structure according to claim 1, wherein the first bearing surface and the second bearing surface are both substantially coplanar.

5. A structure as claimed in claim 1, including at least one continuous differential pumping groove through said second region of said porous material, between said exhaust groove and the the interior of said vacuum chamber, said second region of said porous material providing on each side of said differential pumping groove lands of said first bearing surface which face said second bearing surface, and a respective differential pumping plenum connecting to said differential pumping groove for connection to a vacuum pump.

6. A structure as claimed in claim 5, comprising a substrate body and a layer of said porous material on said body to form said first bearing surface, said differential pumping plenum being formed in said substrate body extending beneath said differential pumping groove and having a width greater than the width of said differential pumping groove so that said layer of said porous material is cantilevered, at least along one edge of the differential pumping groove, over the underlying differential pumping plenum, said substrate body having bridging elements crossing over said differential pumping plenum to support said at least one cantilevered edge of the differential pumping groove.

7. A structure as claimed in claim 6, wherein said first and second regions of the porous material have coplanar surfaces forming said first bearing surface.

8. A structure as claimed in claim 1, wherein at least said first region of the porous material has a surface forming said second bearing surface which is impregnated to provide a substantially uniform porosity at said surface which is lower than the porosity of the porous material.

9. A vacuum bearing structure comprising:
    a vacuum chamber including a wall having an aperture,
    a movable member arranged to extend through said aperture,
    a bearing between said vacuum chamber wall and said movable member allowing a predetermined movement therebetween, first and second spaced opposed sealing surfaces on said vacuum chamber wall and said movable member, a continuous differential pumping groove in said first sealing surface, respective lands of said first sealing surface on each side of said differential pumping groove, a differential pumping plenum extending beneath said differential pumping groove along substantially the entirety of the dimension transverse to the width dimension of said differential pumping groove and having a width greater than the width of said differential pumping groove so that at least one edge of the differential pumping groove is cantilevered over the underlying differential pumping plenum, and bridging elements crossing over said differential pumping plenum under said differential pumping groove to support said at least one cantilevered edge of the differential pumping groove.

10. A vacuum bearing structure as claimed in claim 9, wherein said differential pumping groove, said differential pumping plenum and said bridge elements are formed in a unitary body of material.

11. A structure as claimed in claim 1, including a source of bearing gas connected to said at least one gas supply plenum and a flow controller for said supply adapted to maintain a gas flow through said porous first region at a minimum rate at which friction between the bearing surfaces is substantially zero.

12. A method of supporting a movable member in an aperture provided in a wall of a vacuum chamber, wherein one of said vacuum chamber wall and said movable member has a first bearing surface and the other has a second bearing surface, and the first and second surfaces extend transverse to the line of action of external pressure acting on said movable member to urge said first and second surfaces towards each other and permit a predetermined movement of said movable member relative to said chamber wall, the method comprising the steps of
    providing a porous gas-permeable material as said first surface facing said second surface, said porous material having a first outer region which is porous to gas flow through the thickness of the material and a second, inner region,
    applying gas under pressure via a gas supply plenum to said first region to permit gas under pressure to percolate through said first region to apply bearing pressure to said second surface opposing the action of said external pressure, and exausthing gas to atmosphere via an exhaust channel between said outer and inner regions.

13. A method as claimed in claim 12, wherein said first, outer and second, inner regions of said porous material are machined together to form said first bearing surface having said first and second regions coplanar.

14. The structure of claim 1 wherein said first and second bearing surfaces are movable with respect to each other only along a single plane.

15. The structure of claim 1 wherein said exhaust groove separates said first region and said second region.

16. The structure of claim 1 wherein said exhaust grove completely separates said porous gas-permeable material in said first region from said porous gas-permeable material in said second region.

17. The structure of claim 9 wherein said bearing includes first and second bearing surfaces movable with respect to each other along a single plane.

18. The structure of claim 17 wherein said first and second bearing surfaces are substantially planar.

19. The structure of claim 17 wherein said first and second bearing surfaces are fixed to said vacuum chamber and said movable member.

20. The method of claim 12 wherein said first and second bearing surfaces are movable with respect to each other only along a single plane.

21. The method of claim 12 wherein said exhaust channel completely separates said outer and inner regions of said porous gas-permeable material.

* * * * *